United States Patent
Saitoh et al.

(10) Patent No.: US 7,998,597 B2
(45) Date of Patent: Aug. 16, 2011

(54) ORGANIC LIGHT EMITTING DEVICE

(75) Inventors: Akihito Saitoh, Yokohama (JP); Keiji Okinaka, Kawasaki (JP); Satoshi Igawa, Fujisawa (JP); Jun Kamatani, Tokyo (JP); Naoki Yamada, Inagi (JP); Masashi Hashimoto, Tokyo (JP); Masanori Muratsubaki, Hachioji (JP); Takao Takiguchi, Chofu (JP); Akihiro Senoo, Kawasaki (JP); Shinjiro Okada, Kamakura (JP); Minako Nakasu, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 349 days.

(21) Appl. No.: 12/296,858

(22) PCT Filed: Apr. 19, 2007

(86) PCT No.: PCT/JP2007/058996
§ 371 (c)(1),
(2), (4) Date: Oct. 10, 2008

(87) PCT Pub. No.: WO2007/123259
PCT Pub. Date: Nov. 1, 2007

(65) Prior Publication Data
US 2009/0302758 A1    Dec. 10, 2009

(30) Foreign Application Priority Data

Apr. 20, 2006 (JP) .................................. 2006-116903
Feb. 21, 2007 (JP) .................................. 2007-040899

(51) Int. Cl.
*H01J 1/62* (2006.01)

(52) U.S. Cl. ............................. 428/690; 257/40; 313/506
(58) Field of Classification Search .................. 428/690; 257/40; 313/506
See application file for complete search history.

(56) References Cited

U.S. PATENT DOCUMENTS

| 5,061,569 | A | 10/1991 | VanSlyke et al. ............. 428/457 |
| 5,256,945 | A | 10/1993 | Imai et al. ..................... 313/504 |
| 6,838,818 | B2 | 1/2005 | Furugori et al. ............. 313/504 |
| 7,229,702 | B2 | 6/2007 | Saitoh et al. .................. 428/690 |
| 7,466,074 | B2 | 12/2008 | Okinaka et al. ............... 313/504 |
| 2003/0054186 | A1* | 3/2003 | Miyashita et al. ............. 428/500 |
| 2004/0189190 | A1* | 9/2004 | Suzuri et al. .................. 313/504 |
| 2006/0017376 | A1 | 1/2006 | Okinaka et al. ............... 313/504 |

FOREIGN PATENT DOCUMENTS

| EP | 1584614 A1 | 10/2005 |
| EP | 1623970 A1 | 2/2006 |
| EP | 1768199 A1 | 3/2007 |
| JP | 04-220995 | 8/1992 |

(Continued)

OTHER PUBLICATIONS

Hashomoto et. al., Effect of Ion. Potential of Hole Transporting layer . . . 2001, Jpn. J. Appl. Phys., vol. 40, pp. 4720-47265.*

(Continued)

*Primary Examiner* — D. Lawrence Tarazano
*Assistant Examiner* — Gregory Clark
(74) *Attorney, Agent, or Firm* — Fitzpatrick, Cella, Harper & Scinto

(57) ABSTRACT

To provide an organic light emitting device having high efficiency and high luminance by making a contrivance to suppress the leakage of an electron or of an exciton, an organic light emitting device of the present invention includes two hole transporting layers having tertiary amine compounds different from each other in structure.

6 Claims, 1 Drawing Sheet

FOREIGN PATENT DOCUMENTS

| | | |
|---|---|---|
| JP | 04-308688 | 10/1992 |
| JP | 05-009471 | 1/1993 |
| JP | 05-234681 | 9/1993 |
| JP | 2001-354668 | 12/2001 |
| JP | 2002-324678 | 11/2002 |
| JP | 2003-201472 * | 7/2003 |

OTHER PUBLICATIONS

Supplementary European Search Report issued in the counterpart application No. 07742431.5 dated Jan. 28, 2011—7 pages.

* cited by examiner

ORGANIC LIGHT EMITTING DEVICE

TECHNICAL FIELD

The present invention relates to an organic light emitting device.

The present invention relates more specifically to an organic light emitting device having a light emitting layer in which two hole transporting layers are interposed between the light emitting layer and an anode.

BACKGROUND ART

An organic light emitting device has recently shown significant progress, and has been suggesting its potential to find use in a wide variety of applications because of the following characteristic: the device can be turned into a thin, lightweight light emitting device which shows high luminance at a low applied voltage, which provides a wide variety of luminous wavelengths, and which has high-speed responsiveness. However, the organic light emitting device still involves a large number of problems to be solved in terms of durability such as a change over time due to long-term use and deterioration due to: an atmospheric gas containing oxygen or moisture. When the application of the device to a full-color display is taken into consideration, the light emission of blue, green, or red light with an additionally long lifetime, additionally high conversion efficiency, and an additionally high color purity has been needed at present, and various proposals have been made to cope with the application.

In addition, for example, Japanese Patent Application Laid-Open No. H04-220995, Japanese Patent Application Laid-Open No. 2002-324678, Japanese Patent Application Laid-Open No. H05-234681, and Japanese Patent Application Laid-Open No. H05-009471 each describe a material and an organic light emitting device each using an aromatic tertiary amine derivative. Japanese Patent Application Laid-Open No. H04-220995 described above describes an organic electroluminescence device obtained by laminating an organic layer containing an aromatic tertiary amine compound having two nitrogen atoms. Japanese Patent Application Laid-Open No. 2002-324678 describes an organic light emitting device formed of a layer containing an amine derivative having a fused ring group with two or more rings. In addition, Japanese Patent Application Laid-Open No. H05-234681 describes an organic electroluminescence device formed of an organic layer containing a tertiary amine having two nitrogen atoms. Japanese Patent Application Laid-Open No. H05-9471 describes an organic electroluminescence device formed of a layer containing a fluorenyldiphenylamine derivative.

The inventors of the present invention have thought that an organic light emitting device described in any one of those documents requires additional improvements so that an organic light emitting device having an optical output with high efficiency and high luminance may be provided. In particular, the inventors of the present invention have noticed that none of the organic light emitting devices described in those documents has a contrivance to suppress the leakage of an electron or of an exciton.

DISCLOSURE OF THE INVENTION

The present invention provides an organic light emitting device having high efficiency and high luminance by making a contrivance to suppress the leakage of an electron or of an exciton.

According to the present invention, there is provided an organic light emitting device including:
  an anode;
  a cathode;
  a light emitting layer;
  a first hole transporting layer; and
  a second hole transporting layer,
  in which:
  the anode, the first hole transporting layer, the second hole transporting layer, and the light emitting layer are placed in an order of the anode, the first hole transporting layer, the second hole transporting layer, and the light emitting layer;
  the first hole transporting layer has at least a tertiary amine compound having two or more nitrogen atoms; and
  the second hole transporting layer has at least a tertiary amine compound having one nitrogen atom.

The present invention can provide an organic light emitting device having high efficiency and high luminance, which has been contrived to suppress the leakage of an electron or of an exciton.

Further features of the present invention will become apparent from the following description of exemplary embodiments with reference to the attached drawings.

BEST MODE FOR CARRYING OUT THE INVENTION

Figure 1:
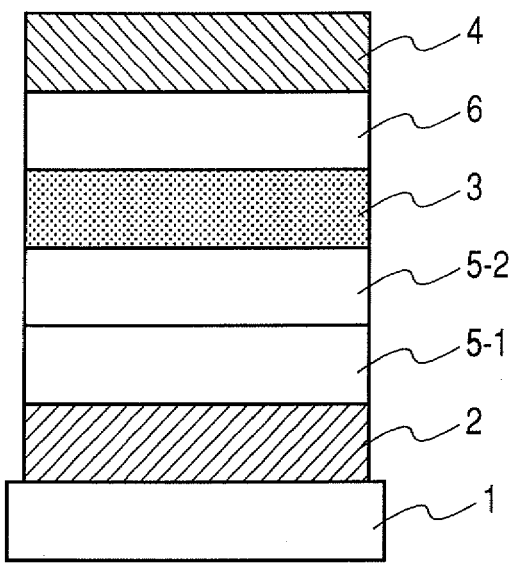
FIG. 1 is a sectional view showing an example of an organic light emitting device in the present invention.

An organic light emitting device of the present invention is a device having an anode, a cathode, a light emitting layer, and two hole transporting layers.

The light emitting layer is formed only of an organic compound. Alternatively, the light emitting layer contains an organic compound.

Any other layer except the light emitting layer and the two hole transporting layers may be interposed between the anode and the cathode. The term "any other layer" refers to an electron injecting layer, an electron transporting layer, or a carrier blocking layer.

In the two hole transporting layers, a hole transporting layer close to the anode is a first hole transporting layer, and a hole transporting layer close to the light emitting layer is a second hole transporting layer.

The first hole transporting layer has at least a tertiary amine compound having two or more nitrogen atoms as a main component. This means that the first hole transporting layer may be formed only of the tertiary amine compound having two or more nitrogen atoms as a main component.

The content (wt %) of the tertiary amine compound having two or more nitrogen atoms in the first hole transporting layer is preferably 50 wt % or more to 100 wt % or less, more preferably 90 wt % or more to 100 wt % or less, or still more preferably 100 wt %.

The tertiary amine of the tertiary amine compound having two or more nitrogen atoms is preferably a non-cyclic tertiary amine.

In addition, a material to be used in the first hole transporting layer preferably has a hole mobility larger than that of a material to be used in the second hole transporting layer from the viewpoints of a reduction in voltage at which the device is driven and durability. In general, the mobility of a layer formed of a tertiary amine compound having two or more nitrogen atoms is lower than that of a layer formed of a tertiary amine compound having one nitrogen atom. Accordingly, in order that the voltage at which the device is driven may be kept low, the mobility of the first hole transporting layer is preferably larger than that of the second hole transporting layer.

Here, a hole mobility can be measured by transient current measurement according to a time-of-flight (TOF) method. Here, a value at a square root of an applied voltage of 500 $(V/cm)^{1/2}$ is adopted for the hole mobility.

The second hole transporting layer has at least a tertiary amine compound having one nitrogen atom as a main component. This means that the second hole transporting layer may be formed only of the tertiary amine compound having one nitrogen atom as a main component. In addition, the second hole transporting layer may contain any other compound containing no nitrogen atom and having a wide energy gap in addition to the tertiary amine compound having one nitrogen atom.

The content of the tertiary amine compound having one nitrogen atom in the second hole transporting layer is preferably 50 wt % or more to 100 wt % or less, more preferably 90 wt % or more to 100 wt % or less, or still more preferably 100 wt %.

The tertiary amine of the tertiary amine compound having one nitrogen atom is preferably a non-cyclic tertiary amine.

The non-cyclic tertiary amine in the above description of the tertiary amine compound possessed by each of the first and second hole transporting layers represents a tertiary amine the substituents of which are not bonded to each other and do not form a ring. When the substituents of the tertiary amine are not bonded to each other, the degree of freedom in the rotation of a molecular structure increases, whereby a molecule having a short conjugated length can be relatively easily designed. As a result, in the case of the tertiary amine compound to be used in the first hole transporting layer, the energy gap of the tertiary amine compound expands, and reabsorption can be prevented.

In addition, in the case of the tertiary amine compound to be used in the second hole transporting layer, the energy gap of the tertiary amine compound expands, and a carrier and/or an exciton can be effectively trapped in the light emitting layer.

In addition, a non-cyclic amine structure has hole conductivity higher than that of a cyclic amine structure such as carbazole. Accordingly, the use of a material having a non-cyclic tertiary amine skeleton can reduce the voltage at which a device is driven. It is because of the foregoing that the tertiary amine is preferably a non-cyclic tertiary amine.

In the organic light emitting device of the present invention, the first hole transporting layer has high hole transporting property and plays a role in improving the property with which a hole is injected from the anode to an organic layer because the layer contains a tertiary amine compound.

In addition, the second hole transporting layer has high hole transporting property because the layer contains a tertiary amine compound. Further, the tertiary amine compound has a short conjugated length because the compound has one nitrogen atom. In addition, the compound plays a role in trapping a carrier and/or an exciton in the light emitting layer because the compound has a wide energy gap.

In view of the foregoing, the inventors of the present invention consider that the presence of the first hole transporting layer reduces the voltage at which the device is driven, and the presence of the second hole transporting layer improves external quantum efficiency.

In addition, the energy gap of the tertiary amine compound having one nitrogen atom in the second hole transporting layer is preferably wider than that of a "compound having the highest content" in the light emitting layer. When the second hole transporting layer additionally contains another compound (such as a non-amine compound), the energy gap of the other compound is also preferably wider than that of the "compound having the highest content". The term "compound having the highest content" as used herein refers to a host material. That is, in this case, the light emitting layer is a layer formed of the host material as a main component and a guest material as an accessory component.

When the compounds can be arranged as described above on the basis of their energy gaps, the injection of a hole into the light emitting layer is promoted, and the leakage of an electron to the second hole transporting layer can be prevented. It should be noted that an energy gap can be determined by measuring a spectrum end of an ultraviolet and visible absorption spectrum.

In addition, an ionization potential Ip (1) of a compound of which the light emitting layer is mainly formed, an ionization potential Ip (2) of a compound of which the first hole transporting layer is mainly formed, and an ionization potential Ip (3) of a compound of which the second hole transporting layer is mainly formed preferably satisfy the relationship of Ip (2)<Ip (3)<Ip (1).

An ionization potential can be determined by, for example, ultraviolet photoelectron spectroscopy (UPS), any other electron spectroscopic approach (such as a measuring device named AC-1 manufactured by RIKENKIKI CO., LTD), or the measurement of an oxidation potential by a cyclic voltammetry method.

A tertiary amine compound represented by the following general formula (1) is shown below as the tertiary amine compound having one nitrogen atom to be used in the second hole transporting layer:

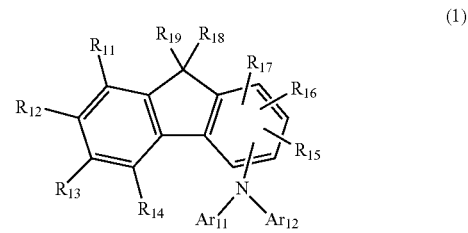

where: $Ar_{11}$, represents a substituted or unsubstituted fluorenyl group to be bonded to N shown in the above-mentioned general formula (1) at any one of 2- to 4-positions; $Ar_{12}$ represents an aryl group or a heterocyclic group, and each of the aryl group and the heterocyclic group may have a substituent; $R_{11}$, to $R_{19}$ are each independently selected from a substituent group consisting of a hydrogen atom, an alkyl group, an aralkyl group, an aryl group, a heterocyclic group, a cyano group, and a halogen group; a substituent in the substituent group may have a substituent; and any two of $R_{11}$, to $R_{19}$ may be bonded to each other to form a ring.

Of the compounds each represented by the general formula (1), a 4-aminofluorene compound is a preferable tertiary amine compound having one nitrogen atom to be used in the second hole transporting layer. The 4-aminofluorene compound has higher steric hindrance and a shorter conjugated length than those of any other compound because a tertiary amine is substituted by a fluorene group at 4-position. The 4-aminofluorene compound is a hole transporting material having a wide energy gap and a high glass transition temperature. As in the case of the foregoing, the compound has an expanding effect on the energy gap of the second hole transporting layer. Further, the use of a material having a high glass transition temperature in the second hole transporting layer is useful in improving the durability of the device because the use stabilizes the film formability of the layer.

Specific examples of a substituent in the compound represented by the above-mentioned general formula (1) are shown below.

Examples of the alkyl group include a methyl group, an ethyl group, a normal-propyl group, an isopropyl group, a normal-butyl group, a tertiary-butyl group, a secondary-butyl group, an octyl group, a 1-adamantyl group, and a 2-adamantyl group.

Examples of the aralkyl group include a benzyl group and a phenethyl group.

Examples of the aryl group include a phenyl group, a naphthyl group, a pentalenyl group, an indenyl group, an azulenyl group, an anthryl group, a pyrenyl group, an indacenyl group, an acenaphthenyl group, a phenanthryl group, a phenalenyl group, a fluoranthenyl group, an acephenanthryl group, an aceanthryl group, a triphenylenyl group, a chrysenyl group, a naphthacenyl group, a perylenyl group, a pentacenyl group, a biphenyl group, a terphenyl group, and a fluorenyl group.

Examples of the heterocyclic group include a thienyl group, a pyrrolyl group, a pyridyl group, an oxazolyl group, an oxadiazolyl group, a thiazolyl group, a thiadiazolyl group, a terthienyl group, a carbazolyl group, an acrydinyl group, and phenanthroryl group.

In addition, examples of the substituent which may be held include: alkyl groups such as a methyl group, an ethyl group, and a propyl group; aralkyl groups such as a benzyl group and a phenethyl group; aryl groups such as a phenyl group and a biphenyl group; heterocyclic groups such as a thienyl group, a pyrrolyl group, and a pyridyl group; amino groups such as dimethylamino group, a diethylamino group, a dibenzylamino group, a diphenylamino group, a ditolylamino group, and a dianisolylamino group; alkoxyl groups such as a methoxyl group, an ethoxyl group, a propoxyl group, and phenoxyl group; cyano groups; and halogen atoms such as fluorine, chlorine, bromine, and iodine.

Examples of the halogen group include a fluorine group, a chlorine group, a bromine group, and an iodine group.

Specific examples of the compound represented by the above-mentioned general formula (1) are shown below. However, the present invention is not limited to these examples. In addition, $Ar_{11}$, shown in any one of Exemplified Compounds 1 to 68 may be combined with $Ar_{12}$ shown in any one of Exemplified Compounds 1 to 68.

| Compound No. | Fluorenyl Group | Ar11 | Ar12 |
|---|---|---|---|
| 1 | 9,9-dimethyl-2,7-di-tert-butyl-4-methylfluorenyl | 9,9-dimethyl-2,7-di-tert-butyl-4-methylfluorenyl | 9,9-dimethyl-2,7-di-tert-butylfluorenyl |
| 2 | 9,9-dimethyl-2,7-di-tert-butyl-4-methylfluorenyl | 9,9-dimethyl-2,7-di-tert-butyl-4-methylfluorenyl | 2-methylbiphenyl |
| 3 | 9,9-dimethyl-2,7-di-tert-butyl-4-methylfluorenyl | 9,9-dimethyl-2,7-di-tert-butyl-4-methylfluorenyl | 9,9-dimethyl-3-methylfluorenyl |
| 4 | 9,9-dimethyl-2,7-di-tert-butyl-4-methylfluorenyl | 9,9-dimethyl-2,7-di-tert-butyl-4-methylfluorenyl | 9,9-dimethyl-2-(3-methylphenyl)fluorenyl |

-continued
| Compound No. | Fluorenyl Group | Ar11 | Ar12 |
|---|---|---|---|
| 5 | 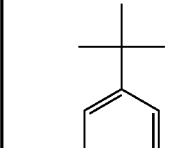 | 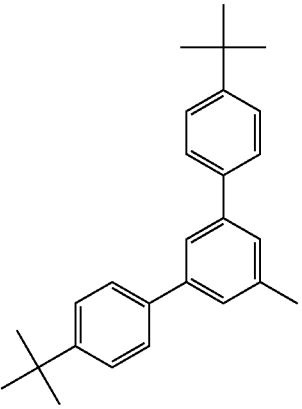 | 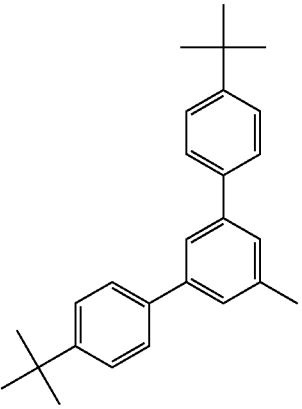 |
| 6 | 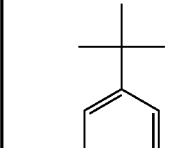 | 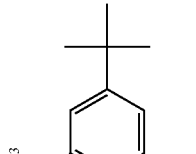 | 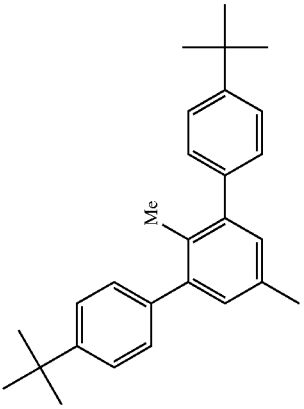 |
| 7 | 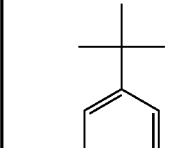 | 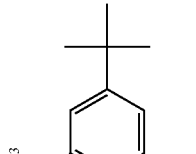 | 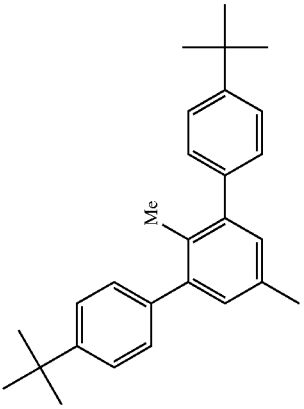 |

-continued

| Compound No. | Fluorenyl Group | Ar11 | Ar12 |
|---|---|---|---|
| 8 | | | |
| 9 | | | |
| 10 | | | |
| 21 | | | |

-continued

| Compound No. | Fluorenyl Group | Ar11 | Ar12 |
|---|---|---|---|
| 22 | | | |
| 23 | | | |
| 24 | | | |
| 25 | | | |

| Compound No. | Fluorenyl Group | Ar11 | Ar12 |
| --- | --- | --- | --- |
| 26 | | | |
| 27 | | | |
| 28 | | | |
| 29 | | | |

-continued

| Compound No. | Fluorenyl Group | Ar11 | Ar12 |
|---|---|---|---|
| 30 | (9,9-dimethylfluorene linked to phenyl-9,9-dimethylfluorene with methyl) | (9,9-dimethylfluorene linked to phenyl-9,9-dimethylfluorene with methyl) | 3,5-dimethyl-4-methylphenyl (mesityl-type, with $CH_3$ groups) |
| 31 | (9,9-dimethylfluorene linked to phenyl-9,9-dimethylfluorene with methyl) | (9,9-dimethylfluorene linked to phenyl-9,9-dimethylfluorene with methyl) | 4-tert-butylphenyl |
| 32 | (9,9-dimethylfluorene linked to phenyl-9,9-dimethylfluorene with methyl) | (9,9-dimethylfluorene linked to phenyl-9,9-dimethylfluorene with methyl) | 3-biphenyl |
| 33 | (di-tert-butyl-9,9-dimethylfluorene linked to methyl-9,9-dimethylfluorene-phenyl) | (di-tert-butyl-9,9-dimethylfluorene linked to methyl-9,9-dimethylfluorene-phenyl) | 3,5-diphenylphenyl |

-continued

| Compound No. | Fluorenyl Group | Ar11 | Ar12 |
| --- | --- | --- | --- |
| 34 | | | |
| 35 | | | |
| 36 | | | |

-continued

| Compound No. | Fluorenyl Group | Ar11 | Ar12 |
|---|---|---|---|
| 37 | (structure) | (structure) | (structure) |
| 38 | (structure) | (structure) | (structure) |
| 39 | (structure) | (structure) | (structure) |
| 40 | (structure) | (structure) | (structure) |
| 41 | (structure) | (structure) | (structure) |

-continued

| Compound No. | Fluorenyl Group | Ar11 | Ar12 |
|---|---|---|---|
| 42 | (structure) | (structure) | (structure) |
| 43 | (structure) | (structure) | (structure) |
| 44 | (structure) | (structure) | (structure) |
| 45 | (structure) | (structure) | (structure) |

| Compound No. | Fluorenyl Group | Ar11 | Ar12 |
| --- | --- | --- | --- |
| 46 | | | |
| 47 | | | |
| 48 | | | |
| 49 | | | |

| Compound No. | Fluorenyl Group | Ar11 | Ar12 |
|---|---|---|---|
| 50 | (9,9-dimethyl-4-methyl-2,7-di-tert-butylfluorenyl) | (9,9-dimethyl-4-methyl-2,7-di-tert-butylfluorenyl) | 3-methyl-5-(9,9-dimethylfluoren-2-yl)phenyl with 9,9-dimethylfluoren-2-yl substituent |
| 51 | (9,9-dimethyl-4-methyl-2,7-di-tert-butylfluorenyl) | (9,9-dimethyl-4-methyl-2,7-di-tert-butylfluorenyl) | 2-methyl-substituted biphenyl with 9,9-dimethylfluoren-2-yl and methyl groups |
| 52 | (9,9-dimethyl-4-methyl-2,7-di-tert-butylfluorenyl) | 7-methyl-2-(9,9-dimethylfluoren-2-yl)-9,9-dimethylfluorenyl | 4-tert-butyl-methylphenyl |

-continued

| Compound No. | Fluorenyl Group | Ar11 | Ar12 |
|---|---|---|---|
| 53 | | | |
| 54 | | | |
| 55 | | | |
| 56 | | | |
| 57 | | | |

-continued

| Compound No. | Fluorenyl Group | Ar11 | Ar12 |
|---|---|---|---|
| 58 | | | |
| 59 | | | |
| 60 | | | |
| 61 | | | |

-continued

| Compound No. | Fluorenyl Group | Ar11 | Ar12 |
|---|---|---|---|
| 62 | (9,9-dimethylfluorenyl with methyl substituents) | (bi-fluorenyl structure with methyl substituents) | CH₃-C₆H₄- (p-tolyl) |
| 63 | (9,9-dimethylfluorenyl with tert-butyl and methyl substituents) | (9,9-dimethylfluorenyl with tert-butyl and methyl substituents) | (biphenyl-fluorenyl structure) |
| 64 | (9,9-dimethylfluorenyl with tert-butyl and methyl substituents) | (9,9-dimethylfluorenyl with tert-butyl and methyl substituents) | (9,9-dimethylfluorenyl-fluorenyl structure) |

-continued

| Compound No. | Fluorenyl Group | Ar11 | Ar12 |
|---|---|---|---|
| 65 | (structure) | (structure) | (structure) |
| 66 | (structure) | (structure) | (structure) |
| 67 | (structure) | (structure) | (structure) |

-continued
| Compound No. | Fluorenyl Group | Ar11 | Ar12 |
|---|---|---|---|
| 68 | 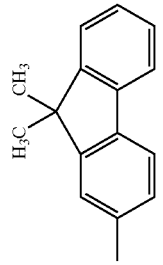 | 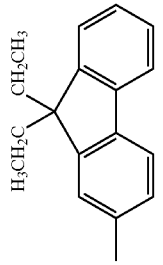 | 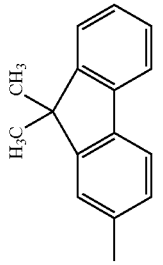 |
| 69 | 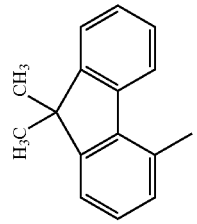 | 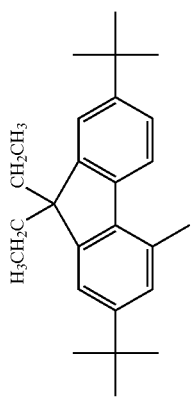 | 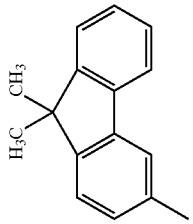 |
| 70 | 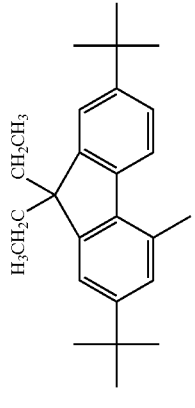 | 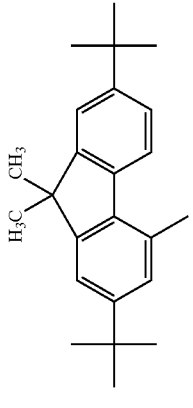 | 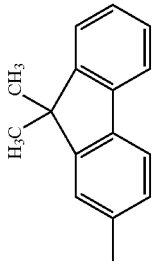 |
| 71 | 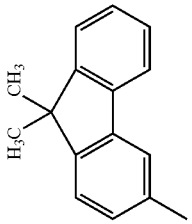 | | |

Figure 2:
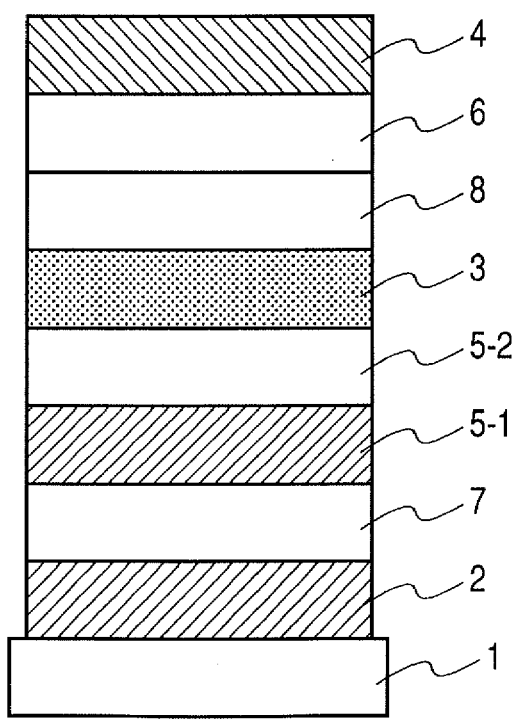
FIG. 2 is a sectional view showing another example of the organic light emitting device in the present invention.

FIGS. 1 and 2 each show a preferable example of the organic light emitting device of the present invention.

FIG. 1 is a sectional view showing an example of the organic light emitting device of the present invention. Reference numeral 1 represents a substrate; 2, an anode; 5-1, a first hole transporting layer; 5-2, a second hole transporting layer; 3, a light emitting layer; 6, an electron transporting layer; and 4, a cathode.

FIG. 2 is a sectional view showing another example of the organic light emitting device of the present invention. FIG. 2 shows a constitution different from that of the organic light emitting device shown in FIG. 1 in which two hole transporting layers are laminated in that a hole injecting layer 7 is interposed as an additional layer between the anode 2 and the first hole transporting layer 5-1 for additionally improving the property with which a hole is injected. In this case, the property with which a hole is injected from the anode to the light emitting layer is excellent, and an additional reduction in voltage at which the device is driven can be achieved. In addition, in the constitution, a layer for blocking the escape of a hole or an exciton to the side of the cathode 4 (hole/exciton blocking layer 8) is inserted between the light emitting layer 3 and the electron transporting layer 6. The constitution is effective in improving the luminous efficiency of the device because a compound having an extremely high ionization potential is used in the hole/exciton blocking layer 8. The other reference numerals shown in FIG. 2 represent the same members as those of FIG. 1.

It should be noted that FIGS. 1 and 2 merely show basic device constitutions, and the present invention is not limited to the constitutions. The organic light emitting device can adopt any one of various layer constitutions such as a constitution in which an insulating layer is provided for an interface between an electrode and an organic layer and a constitution in which an adhesive layer or an interference layer is provided for the interface.

In the organic light emitting device of the present invention, a layer composed of a compound of the present invention and a layer composed of another organic compound are formed by the following methods. In general, a thin film is formed by a vacuum vapor deposition method, an ionized vapor deposition method, sputtering, or plasma. Alternatively, a thin film is formed by: dissolving a material for the film in an appropriate solvent; and applying the solution by a known application method (such as spin coating, dipping, a cast method, an LB method, or an ink-jet method). In particular, when a film is formed by an application method, the film can be formed in combination with an appropriate binder resin.

A material for the anode desirably has as large a work function as possible, and examples of a material that can be used include: metal elements such as gold, platinum, silver, copper, nickel, palladium, cobalt, selenium, vanadium, and tungsten, or alloys of the metal elements; and metal oxides such as tin oxide, zinc oxide, indium oxide, indium tin oxide (ITO), and indium zinc oxide. A conductive polymer such as polyaniline, polypyrrole, polythiophene, or polyphenylene sulfide can also be used. Each of those electrode substances can be used alone, or two or more of them can be used in combination. In addition, the anode may be constituted of a single layer, or may be constituted of multiple layers.

On the other hand, a material for the cathode desirably has a small work function, and examples of a material that can be used include: metal elements such as lithium, sodium, potassium, calcium, magnesium, aluminum, indium, ruthenium, titanium, manganese, yttrium, silver, lead, tin, and chromium; and alloys each composed of two or more of the metal elements such as a lithium-indium alloy, a sodium-potassium alloy, a magnesium-silver alloy, an aluminum-lithium alloy, an aluminum-magnesium alloy, and a magnesium-indium alloy. A metal oxide such as indium tin oxide (ITO) can also be used. Each of those electrode substances can be used alone, or two or more of them can be used in combination. In addition, the cathode may be constituted of a single layer, or may be constituted of multiple layers.

A substrate to be used in the present invention is not particularly limited, and an opaque substrate such as a metallic substrate or a ceramic substrate, or a transparent substrate such as glass, quartz, or a plastic sheet is used. In addition, a color filter film, a fluorescent color conversion filter film, a dielectric reflective film, or the like can be used in the substrate to control colored light.

It should be noted that the produced device can be provided with a protective layer or a sealing layer for the purpose of preventing the device from coming into contact with, for example, oxygen or moisture. Examples of the protective layer include: a diamond thin film; an inorganic material film made of, for example, a metal oxide or a metal nitride; a polymer film such as a fluorine resin, polyparaxylene, polyethylene, a silicone resin, or a polystyrene resin; and a photocurable resin. In addition, the device itself can be covered with glass, a gas impermeable film or a metal, and the device itself can be packaged with an appropriate sealing resin.

Alternatively, the organic light emitting device of the present invention can be connected to a thin-film transistor (TFT) produced on a substrate for controlling whether or not the organic light emitting device emits light.

Such device can be mounted on a display so as to be utilized as a pixel of a display region.

Hereinafter, the present invention will be described more specifically by way of examples. However, the present invention is not limited to those examples.

EXAMPLE 1

An organic light emitting device having the structure as shown in FIG. 1 was produced by the following method.

Indium tin oxide (ITO) was formed into a film having a thickness of 120 nm by a sputtering method to serve as an anode 2 on a glass substrate as a substrate 1, and the resultant was used as a transparent, conductive supporting substrate. The resultant was subjected to ultrasonic cleaning in acetone and isopropyl alcohol (IPA) sequentially, and was then subjected to boiling cleaning in IPA, followed by drying. Further, the resultant which has been subjected to UV/ozone cleaning was used as a transparent, conductive supporting substrate.

A chloroform solution was prepared by using Compound 1 represented by the following structural formula as a hole transporting material in such a manner that the concentration of the compound become 0.2 wt %.

The solution was dropped onto the above-mentioned ITO electrode, and the whole was subjected to spin coating initially at a number of revolutions of 500 RPM for 10 seconds and then at a number of revolutions of 1,000 RPM for 1 minute, whereby a film was formed. After that, the resultant was dried for 10 minutes in a vacuum oven at 80° C., whereby the solvent in the thin film was completely removed. The formed first hole transporting layer 5-1 had a thickness of 15 nm.

Further, Compound 2 represented by the following structural formula was deposited from the vapor, whereby the second hole transporting layer 5-2 having a thickness of 20 nm was formed.

Next, the light emitting layer 3 having a thickness of 25 nm was provided on the hole transporting layer 5-2 by co-depositing Compound 3 represented by the following structural formula and Compound 4 represented by the following structural formula from the vapor. The layer was formed under conditions including a degree of vacuum at the time of the vapor deposition of $1.0\times10^{-4}$ Pa and a film deposition rate at the time of the vapor deposition of 0.2 to 0.3 nm/sec.

Further, 2,9-[2-(9,9'-dimethylfluorenyl)]-1,10-phenanthroline was formed into the electron transporting layer 6 having a thickness of 25 nm by a vacuum vapor deposition method. The layer was formed under conditions including a degree of vacuum at the time of the vapor deposition of $1.0\times10^{-4}$ Pa and a film deposition rate at the time of the vapor deposition of 0.2 to 0.3 nm/sec.

Next, lithium fluoride (LiF) was formed into a film having a thickness of 0.5 nm by a vacuum vapor deposition method on the previous organic layer. Further, an aluminum film having a thickness of 100 nm was provided as an electron injecting electrode (cathode 4) on the resultant by a vacuum vapor deposition method, whereby an organic light emitting device was produced. The degree of vacuum at the time of the vapor deposition was $1.0\times10^{-4}$ Pa, lithium fluoride was formed into a film at a film formation rate of 0.05 nm/sec, and aluminum was formed into a film at a film formation rate of 1.0 to 1.2 nm/sec.

The resultant organic EL device was covered with a protective glass plate and sealed with an acrylic resin-based adhesive in a dry air atmosphere in order that the device might not deteriorate owing to the adsorption of moisture. Here, the energy gap of Compound 2 is larger than that of Compound 4. In addition, Compound 1, Compound 2, and Compound 4 are arranged as follows with respect to the magnitude of ionization potential: Compound $1\leqq$Compound $2\leqq$Compound 4.

The device of this example was observed to emit light with a luminous efficiency of 5.3 lm/W at an applied voltage of 4 V. In addition, the device was observed to emit blue light having CIE chromaticity coordinates (x, y) of (0.15, 0.17) and a good color purity.

Further, a voltage was applied to the device under a nitrogen atmosphere for 100 hours. As a result, the device was observed to emit good light continuously.

Compound 1

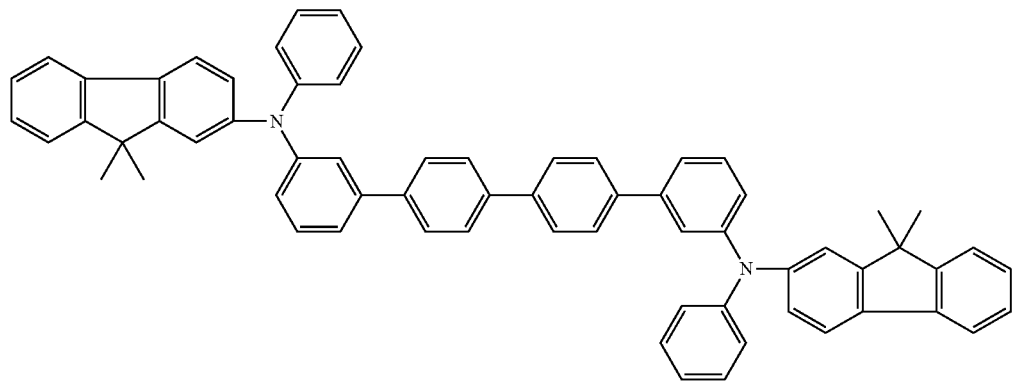

Compound 2

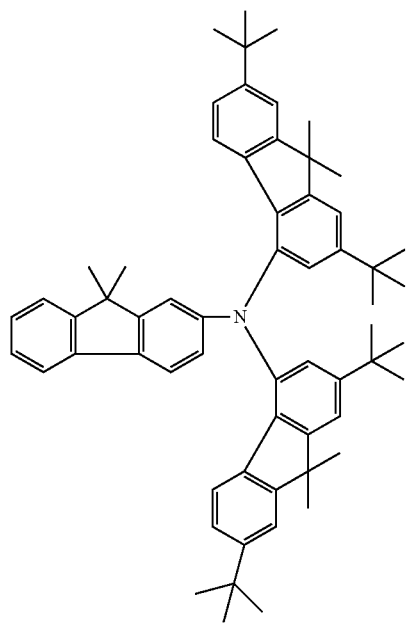

Compound 3

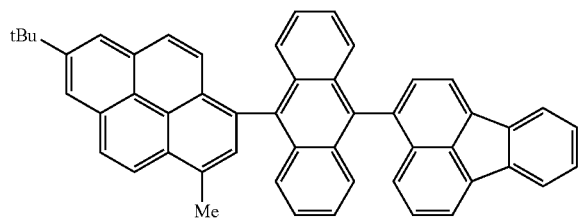

Compound 4

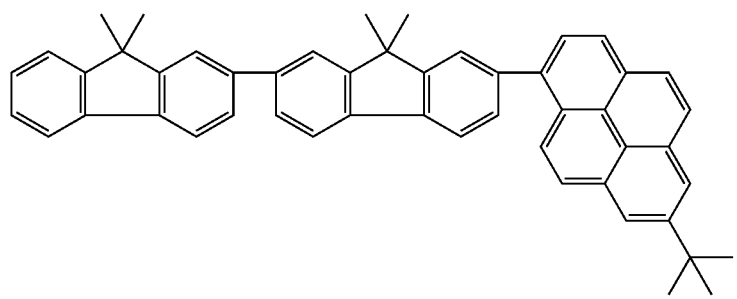

EXAMPLE 2

A device was produced in the same manner as in Example 1 except that: Compound 5 was used instead of Compound 1; and Compound 6 was used instead of Compound 3.

Here, the energy gap of Compound 2 is larger than that of Compound 4. In addition, Compound 2, Compound 4, and Compound 5 are arranged as follows with respect to the magnitude of ionization potential: Compound 5≦Compound 2≦Compound 4. The first hole transporting layer had a thickness of 13 nm. The device of this example was observed to emit light with a current density of 3.9 mA/cm², a light emission luminance of 331 cd/m², and a luminous efficiency of 6.7 lm/W at an applied voltage of 4 V. In addition, the emission of good blue light was observed.

formed hole transporting layer 5 had a thickness of 33 nm. The hole mobility of the hole transporting layer is $1.4 \times 10^{-3}$ cm²/V·s when the square root of an applied voltage is 500 $(V/cm)^{1/2}$.

Further, a light emitting layer, an electron transporting layer, and an Al electrode were each produced in the same manner as in Example 2.

A voltage of 4.0 V was applied to the device thus obtained while the ITO electrode (anode 2) was used as a positive electrode and the Al electrode (cathode 4) was used as a negative electrode. As a result, the device was observed to emit light with a current density of 3.0 mA/cm², a light emission luminance of 83.3 cd/m², and a luminous efficiency of 2.2 lm/W. In addition, light emission was observed.

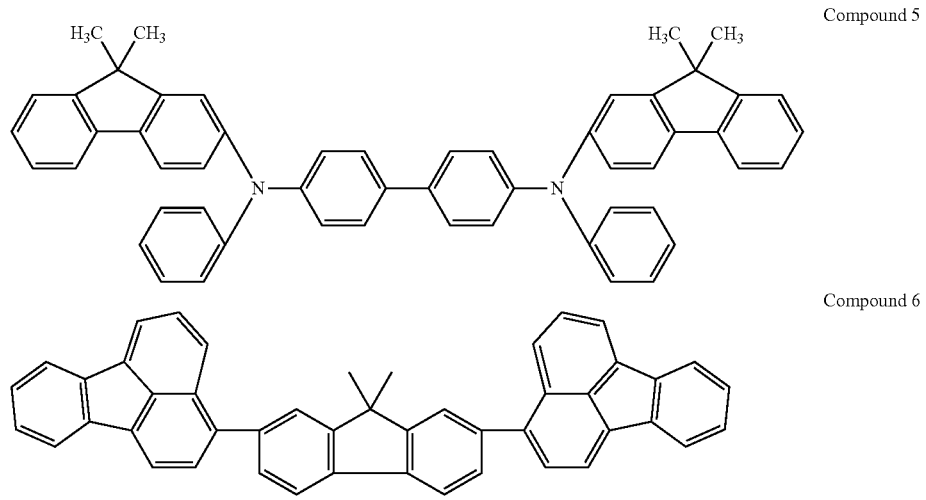

Compound 5

Compound 6

COMPARATIVE EXAMPLE 1

An organic light emitting device having only one hole transporting layer was produced.

To form a hole transporting layer 5, a chloroform solution of Compound 5 having a concentration of 0.24 wt % was prepared.

The solution was dropped onto the above-mentioned ITO electrode, and the resultant was subjected to spin coating first at a number of revolutions of 500 RPM for 10 seconds and then at a number of revolutions of 1,000 RPM for 1 minute, whereby a thin film was formed. After that, the thin film was dried in a vacuum oven at 80° C. for 10 minutes so that the solvent in the thin film would be completely removed. The

COMPARATIVE EXAMPLE 2

To form a hole transporting layer 5, a chloroform solution of Compound 2 having a concentration of 0.24 wt % was prepared.

The solution was dropped onto the above-mentioned ITO electrode, and the resultant was subjected to spin coating first at a number of revolutions of 500 RPM for 10 seconds and then at a number of revolutions of 1,000 RPM for 1 minute, whereby a thin film was formed. After that, the thin film was dried in a vacuum oven at 80° C. for 10 minutes so that the solvent in the thin film would be completely removed. The formed hole transporting layer 5 had a thickness of 33 nm.

The hole mobility of the hole transporting layer is $3.3 \times 10^{-4}$ cm$^2$/V·s when the square root of an applied voltage is 500 (V/cm)$^{1/2}$.

Further, a light emitting layer, an electron transporting layer, and an Al electrode were each produced in the same manner as in Example 2.

A voltage of 4.0 V was applied to the device thus obtained while the ITO electrode (anode 2) was used as a positive electrode and the Al electrode (cathode 4) was used as a negative electrode. As a result, the device was observed to emit light with a current density of 2.5 mA/cm$^2$, a light emission luminance of 174 cd/m$^2$, and a luminous efficiency of 5.5 lm/W. In addition, the emission of blue light was observed.

As described above, the device of Example 2 is improved as compared to the devices of Comparative Examples 1 and 2 in terms of the following points (1) an increase in current upon driving at a constant voltage (which means that the device can be driven at a low voltage) and (2) an improvement in luminous efficiency. In addition, as can be seen from Example 2 and Comparative Examples 1 and 2, a device can be driven at a low voltage when the hole mobility of a first hole transporting layer is larger than that of a second hole transporting layer. In this case, a mobility of $5 \times 10^{-4}$ cm$^2$/V·s or more is desirable upon exercise of the driving of the device at a low voltage.

EXAMPLE 3

A device was produced in the same manner as in Example 2 except that Compound 7 was used instead of Compound 2 of Example 2.

The device of this example was observed to emit light with a current density of 3.4 mA/cm$^2$, a light emission luminance of 202 cd/m$^2$, and a luminous efficiency of 4.7 lm/W at an applied voltage of 4 V. In addition, the emission of good blue light was observed.

Here, the energy gap of Compound 7 is larger than that of Compound 4. In addition, Compound 4, Compound 5, and Compound 7 are arranged as follows with respect to the magnitude of ionization potential: Compound 5≦Compound 7≦Compound 4.

EXAMPLE 4

A device was produced in the same manner as in Example 2 except that Compound 8 was used instead of Compound 2 of Example 2.

The hole mobility of the hole transporting layer formed of Compound 8 was $4.5 \times 10^{-4}$ cm$^2$/V·s when the square root of an applied voltage was 500 (V/cm)$^{1/2}$.

The device of this example was observed to emit light with a current density of 5.2 mA/cm$^2$, a light emission luminance of 332 cd/m$^2$, and a luminous efficiency of 5.0 lm/W at an applied voltage of 4 V. In addition, the emission of good blue light was observed.

Here, the energy gap of Compound 8 is larger than that of Compound 4. In addition, Compound 4, Compound 5, and Compound 8 are arranged as follows with respect to the magnitude of ionization potential: Compound 5≦Compound 8≦Compound 4.

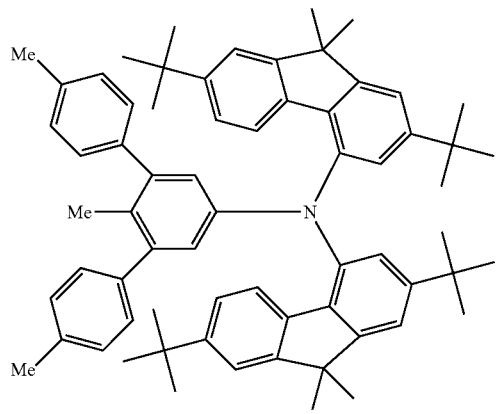

Compound 7

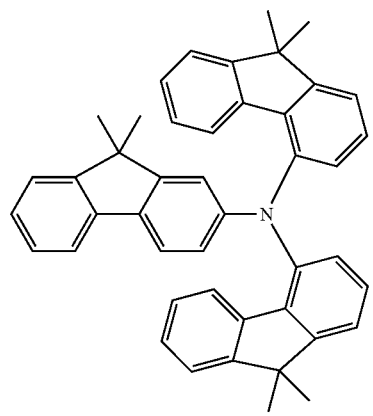

Compound 8

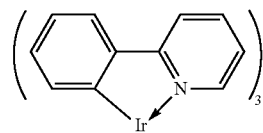

Compound 9

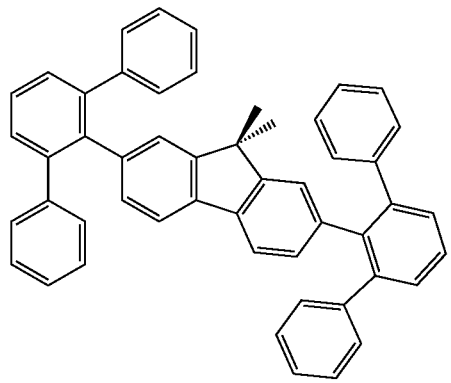

Compound 10

-continued

Compound 11

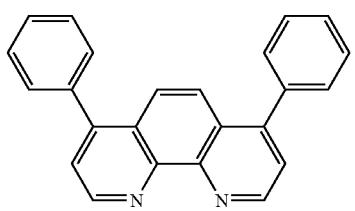

EXAMPLE 5

A device was produced in the same manner as in Example 2 except that: Compound 10 was used instead of Compound 4; Compound 9 was used instead of Compound 3; and the electron transporting layer 6 having a thickness of 50 nm was formed by using Compound 11 instead of the 2,9-[2-(9,9'-dimethylfluorenyl)]-1,10-phenanthroline compound.

The device of this example was observed to emit light with a current density of 0.04 mA/cm², a light emission luminance of 17.4 cd/m², and a luminous efficiency of 34.2 lm/W at an applied voltage of 4 V. In addition, the emission of green light having a good color purity was observed.

Here, the energy gap of Compound 2 is larger than that of Compound 10. In addition, Compound 2, Compound 5, and Compound 10 are arranged as follows with respect to the magnitude of ionization potential: Compound 5≦Compound 2≦Compound 10.

This application claims the benefit of Japanese Patent Application No. 2006-116903, filed Apr. 20, 2006, and Japanese Patent Application No. 2007-040899, filed Feb. 21, 2007, which are hereby incorporated by reference herein in their entirety.

The invention claimed is:

1. An organic light emitting device comprising:
   an anode;
   a cathode;
   a light emitting layer;
   a first hole transporting layer; and
   a second hole transporting layer,
   wherein:
   the anode, the first hole transporting layer, the second hole transporting layer, and the light emitting layer are placed in an order of the anode, the first hole transporting layer, the second hole transporting layer, and the light emitting layer;
   the first hole transporting layer comprises a tertiary amine compound represented by any one of the following formulae:

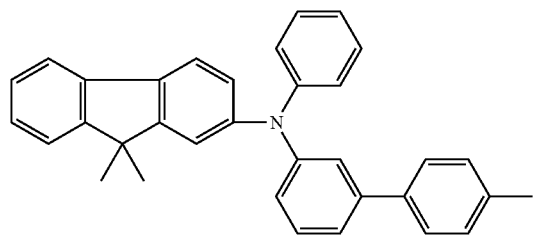

-continued

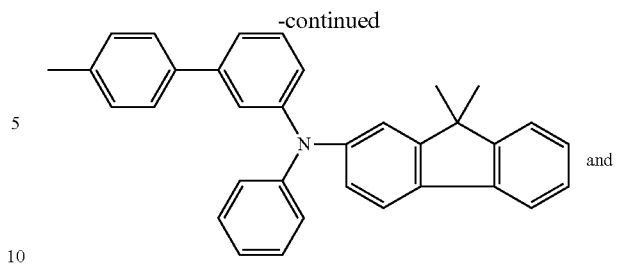

and

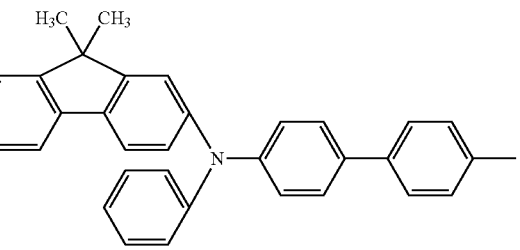

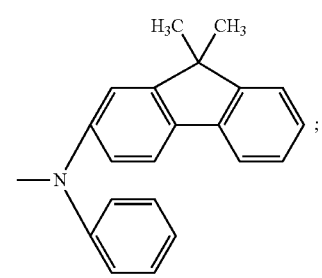

and the second hole transporting layer comprises a tertiary amine compound represented by any one of the following formulae:

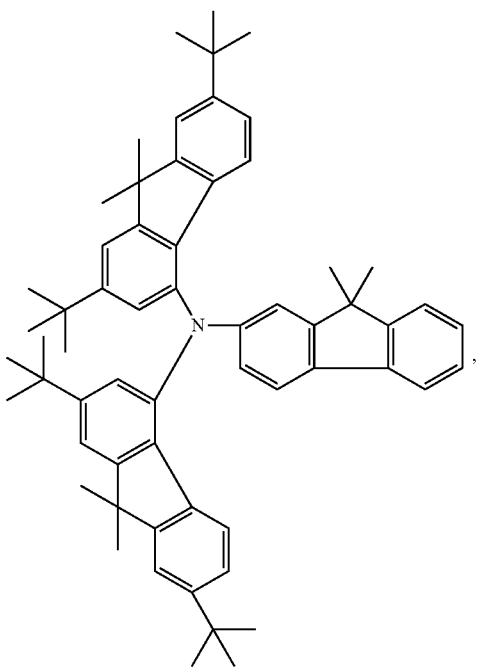

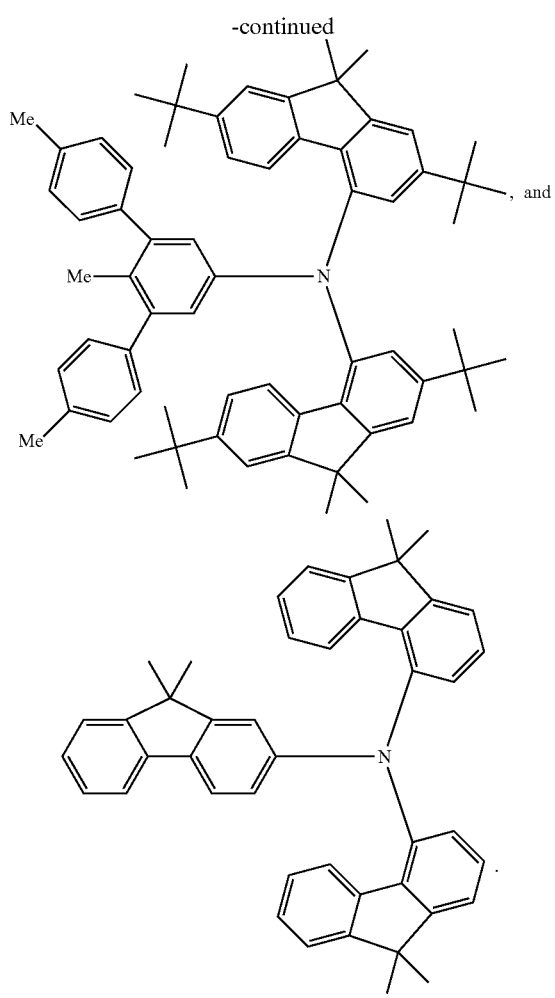, and

2. The organic light emitting device according to claim 1, wherein a hole mobility of the first hole transporting layer is larger than a hole mobility of the second hole transporting layer.

3. The organic light emitting device according to claim 1, wherein an ionization potential Ip of the tertiary amine compound having two or more nitrogen atoms, an ionization potential Ip of the tertiary amine compound having one nitrogen atom, and an ionization potential Ip of an organic compound of which the light emitting layer is mainly formed satisfy a relationship of the ionization potential Ip of the tertiary amine compound having two or more nitrogen atoms<the ionization potential Ip of the tertiary amine compound having one nitrogen atom<the ionization potential Ip of the organic compound of which the light emitting layer is mainly formed.

4. A display comprising:
   a substrate;
   the organic light emitting device according to claim 1; and
   a thin film transistor for controlling when the organic light emitting device emits light,
   the organic light emitting device and the thin film transistor being provided on the substrate,
   wherein the organic light emitting device is provided in a display region as a pixel.

5. The organic light emitting device according to claim 1, wherein the light emitting layer comprises a compound represented by any one of the following formulae:

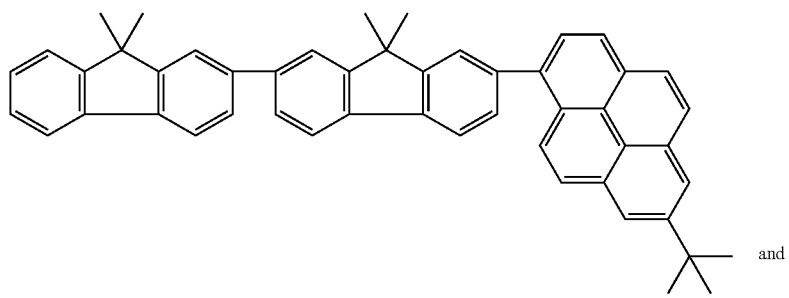 and

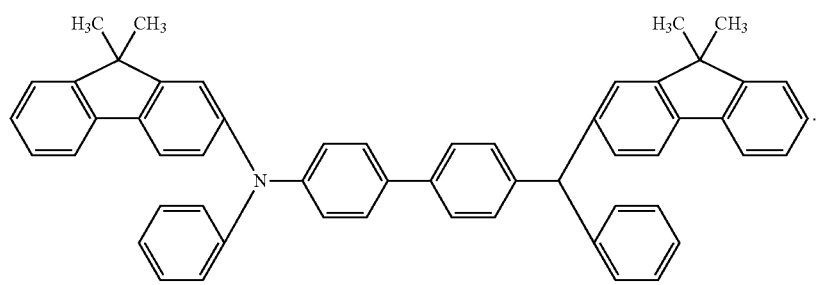.

6. The organic light emitting device according to claim 1, wherein the light emitting layer further comprises a compound represented by any one of the following formulae:
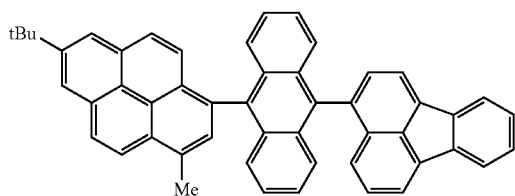
and
-continued
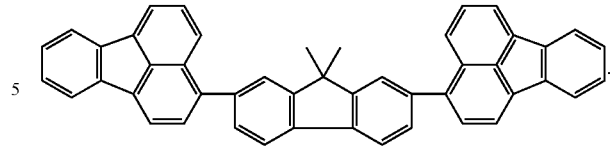
* * * * *